US012573809B2

(12) United States Patent
Ogawa

(10) Patent No.: US 12,573,809 B2
(45) Date of Patent: Mar. 10, 2026

(54) SEMICONDUCTOR LASER DEVICE

(71) Applicant: Mitsubishi Electric Corporation, Tokyo (JP)

(72) Inventor: Nobuyuki Ogawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 594 days.

(21) Appl. No.: 18/002,647

(22) PCT Filed: Oct. 1, 2020

(86) PCT No.: PCT/JP2020/037439
§ 371 (c)(1),
(2) Date: Dec. 20, 2022

(87) PCT Pub. No.: WO2022/070388
PCT Pub. Date: Apr. 7, 2022

(65) Prior Publication Data
US 2023/0246412 A1 Aug. 3, 2023

(51) Int. Cl.
*H01S 5/02315* (2021.01)
*H01S 5/0237* (2021.01)
*H01S 5/042* (2006.01)

(52) U.S. Cl.
CPC ........ *H01S 5/02315* (2021.01); *H01S 5/0237* (2021.01); *H01S 5/04256* (2019.08)

(58) Field of Classification Search
CPC ............... H01S 5/02315; H01S 5/0237; H01S 5/04256; H01S 2301/176
See application file for complete search history.

(56) References Cited

U.S. PATENT DOCUMENTS

2008/0175290 A1* 7/2008 Satoyoshi ........... H01S 5/34326
438/26
2008/0191365 A1* 8/2008 Ueda ...................... H01S 5/023
257/778
(Continued)

FOREIGN PATENT DOCUMENTS

JP 861-127661 A 8/1986
JP H10-022570 A 1/1998
(Continued)

OTHER PUBLICATIONS

International Search Report issued in PCT/JP2020/037439; mailed Dec. 8, 2020.
(Continued)

*Primary Examiner* — Yuanda Zhang
(74) *Attorney, Agent, or Firm* — Studebaker Brackett PLLC

(57) ABSTRACT

A semiconductor laser device includes a submount having a bottom plate part and a projecting part projecting from a surface of the bottom plate part, and a semiconductor laser bonded to the submount. The semiconductor laser includes a semiconductor substrate, a semiconductor structure part that is formed on the semiconductor substrate and has an active layer, a first electrode, and a second electrode. A side face of the semiconductor laser facing the projecting part, and the second electrode thereof are respectively bonded to the projecting part facing the semiconductor laser and the bottom plate part with a bonding member. The bonding member for bonding the projecting part and the side face of the semiconductor laser is such that an end part thereof in a z-direction in which the projecting part projects is located further away in the z-direction than a surface of the semiconductor substrate of the semiconductor laser.

8 Claims, 6 Drawing Sheets

(56) References Cited

U.S. PATENT DOCUMENTS

2011/0134948 A1 * 6/2011 Kawakami ......... H01S 5/04252
                                                    372/46.01
2011/0211610 A1    9/2011 Saito et al.

FOREIGN PATENT DOCUMENTS

JP      2011-181690 A     9/2011
JP      2016-162878 A     9/2016
JP      2019-212859 A    12/2019

OTHER PUBLICATIONS

An Office Action mailed by the State Intellectual Property Office of the People's Republic of China on Aug. 30, 2024, which corresponds to Chinese Patent Application No. 202080105485.4 and is related to U.S. Appl. No. 18/002,647; with English language translation.

* cited by examiner

SEMICONDUCTOR LASER DEVICE

TECHNICAL FIELD

The present application relates to a semiconductor laser device.

BACKGROUND ART

Typically, in a semiconductor laser device, a chip-shaped semiconductor laser is bonded to a submount. A semiconductor laser device may be required to operate in a wide temperature range of, for example, −40° C. to 95° C. In order to operate a semiconductor laser device in a wide temperature range of −40° C. to 95° C., a typical semiconductor laser device is mounted on a package such as a can package together with a temperature control mechanism such as a Peltier cooler for cooling the semiconductor laser device in operation, or on an optical module modularized together with other optical components. In order to reduce the size of a packaged semiconductor laser device or of an optical module in which a semiconductor laser device is mounted, a semiconductor laser device that does not require temperature control by a temperature control mechanism and that can perform so-called an uncooled operation is sometimes required.

In order to achieve a semiconductor laser device capable of an uncooled operation over a wide temperature range, it is necessary to sufficiently dissipate heat generated by the semiconductor laser without a temperature control mechanism, and thus improvement in the heat dissipation is required. In Patent Document 1, a semiconductor laser device is disclosed in which a nitride semiconductor laser formed on an insulating substrate is inserted into a depressed part of a base (submount) having a metal formed on an inner surface thereof in order to improve heat dissipation. Patent Document 2 discloses a semiconductor laser device in which a semiconductor laser is mounted such that, in a submount with a L-shaped cross section that has a first submount and a second submount bonded to the first submount with an epoxy resin, printed wiring formed on the side face of the second submount and printed wiring formed on the surface of the first submount are connected to a first electrode and a second electrode via a solder pattern, respectively.

CITATION LIST

Patent Document

Patent Document 1: Japanese Patent Application Publication Laid-open, No. H10-22570 (FIG. 3)
Patent Document 2: Japanese Patent Application Publication Laid-open, No. 2019-212859 (FIG. 14)

SUMMARY OF INVENTION

Problems to be Solved by Invention

In the semiconductor laser device disclosed in Patent Document 1, the semiconductor laser is connected to the bottom surface and the side faces on the bottom surface side in the depressed part of the submount, and thus the heat cannot be sufficiently dissipated from the side faces of the semiconductor laser to the side faces of the depressed part of the submount. Therefore, it is difficult for the semiconductor laser device of Patent Document 1 to perform an uncooled operation over a wide temperature range.

The semiconductor laser in the semiconductor laser device of Patent Document 2 is provided with a first electrode that is connected to a contact layer and disposed to extend on the side faces and rear surface of a semiconductor substrate, and a second electrode formed on the rear surface of the semiconductor substrate, the contact layer being the uppermost layer of a ridge including an active layer, and the semiconductor laser is a wire-bond-less semiconductor laser in which the first electrode connected to the contact layer of the ridge is connected to the submount without using a wire. The second electrode formed on the rear surface of the semiconductor substrate is insulated by a projecting part covered with an insulating film from the first electrode extending from the side faces. In the semiconductor laser device of Patent Document 2, heat dissipation from the rear surface of the semiconductor laser is mainly performed by a path from the second electrode to the first submount through the solder pattern, the second electrode being narrowed to about one third by being interposed between the projecting parts. In addition, heat dissipation from the side face of the semiconductor laser is mainly performed by a path from the first electrode disposed in the depressed part narrowed to about one third to the second submount through the solder pattern. The first submount and the second submount are insulated from each other by an epoxy resin. Therefore, the semiconductor laser device in Patent Document 2 cannot sufficiently dissipate the heat from the side faces of the semiconductor laser via the second submount to the first submount having a large volume. Therefore, it is difficult for the semiconductor laser device of Patent Document 2 to perform an uncooled operation over a wide temperature range.

It is an object of the technology disclosed in the present specification to achieve a semiconductor laser device capable of an uncooled operation over a wide temperature range.

Means for Solving Problems

A semiconductor laser device of one example disclosed in the present specification includes a submount having a bottom plate part and a projecting part projecting from a surface of the bottom plate part, and a semiconductor laser bonded to the submount. The semiconductor laser includes a semiconductor substrate, a semiconductor structure part that is formed on a surface of the semiconductor substrate and has an active layer for generating light emitted from an emission end face, a first electrode formed on a surface of the semiconductor structure part opposite to the semiconductor substrate, and a second electrode formed on a rear surface of the semiconductor substrate. A side face of the semiconductor laser facing the projecting part, and the second electrode are respectively bonded to a side face of the projecting part facing the semiconductor laser and a surface of the bottom plate part with a bonding member. The bonding member for bonding the side face of the projecting part and the side face of the semiconductor laser is such that an end part thereof in a z-direction in which the projecting part projects is located further away in the z-direction than the surface of the semiconductor substrate of the semiconductor laser.

Effect of Invention

The semiconductor laser device of one example disclosed in the specification of the present application is such that the side face of the semiconductor laser and the second electrode on the rear surface side thereof are bonded to the side face of the projecting part of the submount and the surface of the bottom plate part thereof that are respectively facing them, with a bonding member, and the end part in the z-direction of the bonding member that bonds the side face of the projecting part and the side face of the semiconductor laser is located further away than the surface of the semiconductor substrate, so that an uncooled operation can be performed over a wide temperature range.

MODES FOR CARRYING OUT INVENTION

Embodiment 1

Figure 1:
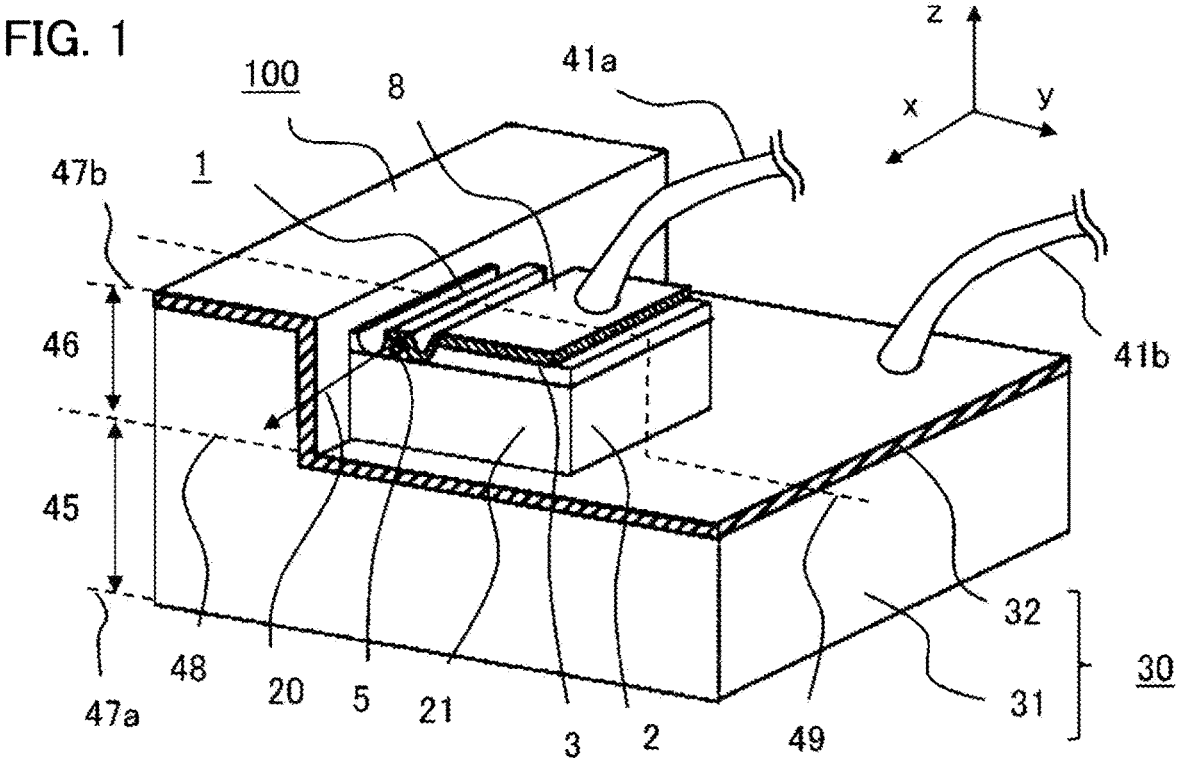
FIG. 1 is a perspective view showing a semiconductor laser device according to Embodiment 1.
Figure 2:
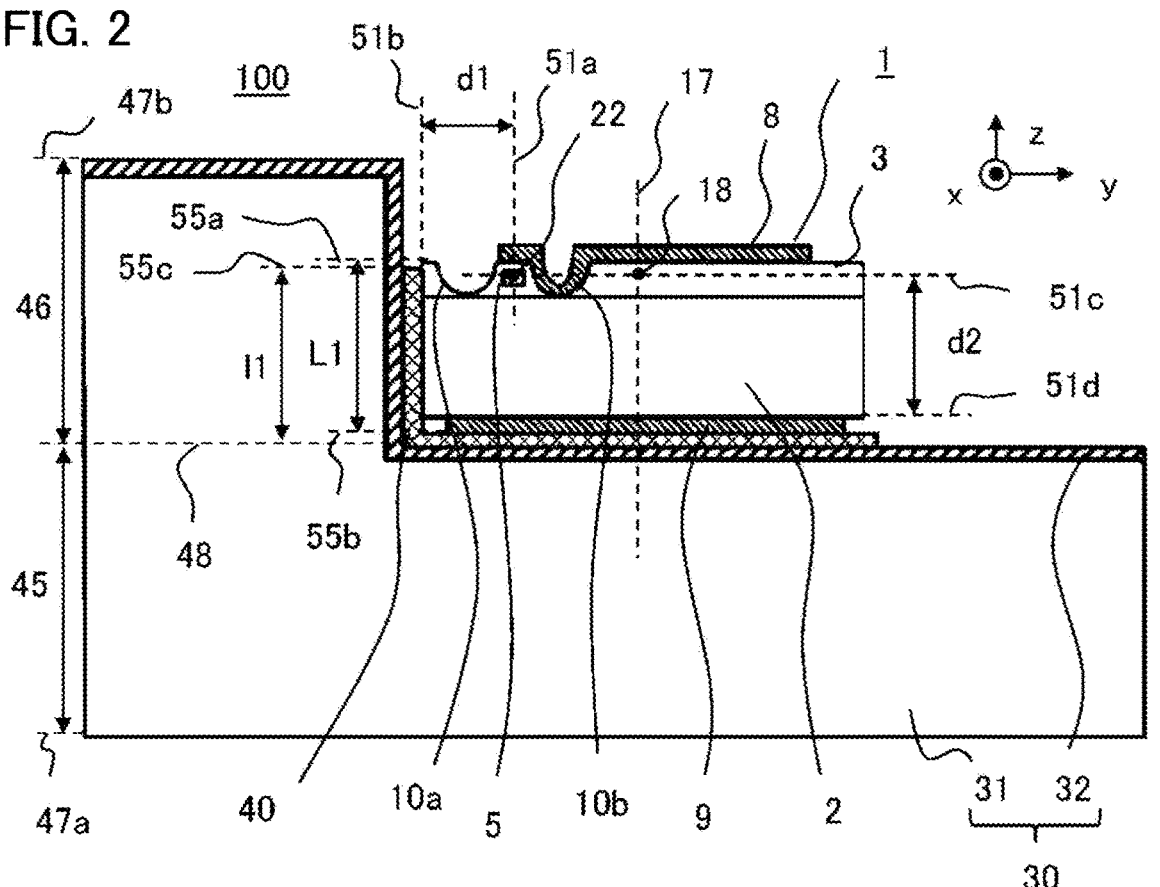
FIG. 2 is a cross-sectional view of the semiconductor laser device of FIG. 1.
Figure 3:
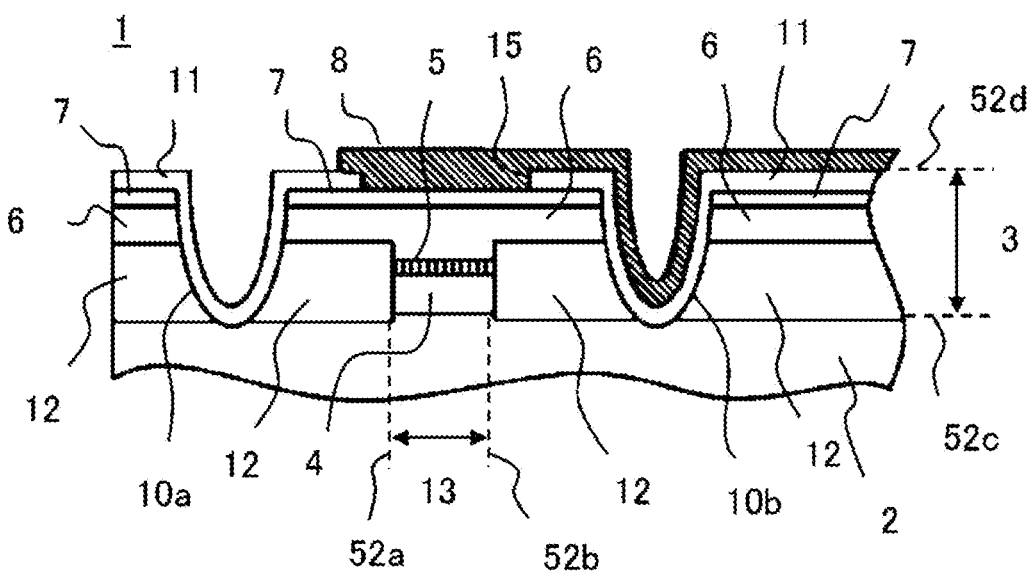
FIG. 3 is a cross-sectional view showing a principal part of a semiconductor structure part in the semiconductor laser of FIG. 1.
Figure 4:
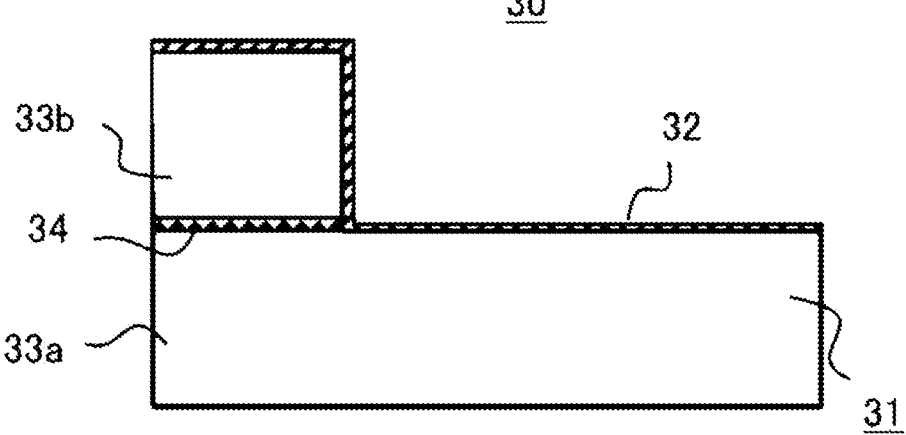
FIG. 4 is a cross-sectional view showing another example of a submount according to Embodiment 1.

FIG. 1 is a perspective view showing a semiconductor laser device according to Embodiment 1, and FIG. 2 is a cross-sectional view of the semiconductor laser device of FIG. 1. FIG. 3 is a cross-sectional view showing a principal part of a semiconductor structure part in the semiconductor laser of FIG. 1, and FIG. 4 is a cross-sectional view showing another example of a submount according to Embodiment 1. FIG. 2 shows a cross section cut in parallel to the z-direction to include a broken line 49 shown in FIG. 1. The semiconductor laser device 100 according to Embodiment 1 includes a semiconductor laser 1 and a submount 30 on which the semiconductor laser 1 is mounted. The semiconductor laser 1 includes a semiconductor substrate 2, a semiconductor structure part 3 that is formed on a surface of the semiconductor substrate 2 and has an active layer 5 for generating light, a first electrode 8 that is a surface electrode formed on a surface of the semiconductor structure part 3 opposite to the semiconductor substrate 2, and a second electrode 9 that is a rear surface electrode formed on a rear surface side of the semiconductor substrate 2. The submount 30 includes a base 31 and a metal layer 32 formed on the side of the base 31 where the semiconductor laser 1 is mounted. The semiconductor laser 1 emits light from an emission end face 21 along an optical axis 20. Further, the semiconductor laser 1 emits light along the optical axis 20 from the emission end face 21 and may emit light along the optical axis 20 from an end face opposite to the emission end face 21. In the optical axis 20, the direction in which light is emitted from the emission end face 21 is indicated by an arrow. In the figure, a direction perpendicular to the semiconductor substrate 2 is a z-direction, a direction parallel to the extending direction in which the active layer 5 extends is a x-direction, and a direction perpendicular to the x-direction and z-direction is a y-direction.

The submount 30 includes a bottom plate part 45 and a projecting part 46 projecting from the bottom plate part 45 in the z-direction, and the submount 30 has an L-shape in the cross section perpendicular to the x axis. The projecting part 46 of the submount 30 extends in the z-direction from the surface of the bottom plate part 45. The submount 30 is an L-shaped submount. The bottom plate part 45 ranges from a broken line 47a to a broken line 48, and the projecting part 46 ranges from the broken line 48 to a broken line 47b. The broken line 47a is the broken line along the surface of the submount 30 opposite to the metal layer 32, that is, the rear surface, and the broken line 47b is the broken line in contact with the furthest portion in the z-direction from the rear surface of the submount 30. The broken line 48 is the broken line along the surface of the submount 30 facing the rear surface of the semiconductor laser 1. The metal layer 32 is formed on the surface of the base 31 in the bottom plate part 45, which is the surface of the submount 30 facing the semiconductor laser 1, and on the surfaces of the base 31 in the y-direction and the z-direction in the projecting part 46. It can also be said that the metal layer 32 is formed on the surface of the bottom plate part 45, which is the surface of the submount 30 facing the semiconductor laser 1, and on the surface of the projecting part 46 in the y-direction. Note that the surface in the y-direction is referred to as a side face as appropriate.

FIG. 1 and FIG. 2 show an example in which the metal layer 32 is also formed on the surface of the base 31 in the projecting part 46 in the z-direction, and the metal layer 32 is formed on the entire surface of the base 31 in the submount 30 on the positive side in the z-direction and the positive side in the y-direction. In the semiconductor laser 1, the second electrode 9 and the side face facing the submount 30 that is the surface on the negative side in the y-direction are bonded to the metal layer 32 of the submount 30 with a bonding member 40 such as a solder material. In FIG. 1, a wire 41a connected to the first electrode 8 of the semiconductor laser 1 and a wire 41b connected to the metal layer 32 of the submount 30 are also shown. The semiconductor laser device 100 is to be connected to an external circuit or the like with the wires 41a and 41b. Note that in the case where the projecting part 46 is not connected to an external circuit or the like from the surface of the projecting part 46 in the z-direction, the metal layer 32 may not be formed on the surface of the projecting part 46 in the z-direction.

The semiconductor laser device 100 of Embodiment 1 is an example in which two surfaces of the semiconductor laser 1 are bonded to the submount 30. Unlike the submounts of Patent Document 2 in which the first submount and the second submount are insulated by an epoxy resin, the submount 30 is provided with the base 31 that is integrally formed so as not to inhibited the heat conduction between the bottom plate part 45 and the projecting part 46, or the base 31 in which two base blocks 33a and 33b are bonded together with a conductive bonding member 34 such as a solder material as shown in FIG. 4. In another example of the submount 30 shown in FIG. 4, the base block 33a is the base in the bottom plate part 45, and the base block 33b is the base in the projecting part 46.

In the semiconductor laser device 100 of Embodiment 1, in order to improve heat dissipation of the radiating heat generated in association with the generation of light to the submount 30, the active layer 5 is disposed at a position close to the side of the projecting part 46 of the submount 30, namely, at an offset position, so that the thermal resistance from the active layer 5 to the side face of the projecting part 46 of the submount 30 is not extremely small or is as equal as possible to the thermal resistance from the active layer 5 to the surface of the bottom plate part 45 of the submount 30. The active layer 5 is disposed closer to the projecting part 46 than a center 18 between side faces, the center being positioned between both the side faces in the y-direction of the semiconductor laser 1. A broken line 17 is the broken line extending in the z-direction including the center 18 between the side faces. More specifically, a distance d1 from a central axis 22 of the active layer 5 parallel to the x-direction to the surface in the y-direction facing the projecting part 46 of the submount 30, namely, the side face of the semiconductor structure part 3 in the semiconductor laser 1 and the side face of the semiconductor substrate 2 is designed to be shorter than a distance d2 from the central axis 22 of the active layer 5 to the rear surface of the semiconductor substrate 2 of the semiconductor laser 1 facing the bottom plate part 45 of the submount 30. A broken line 51a is the broken line that extends in the z-direction and includes the central axis 22, and a broken line 51c is the broken line that extends in the y-direction and includes the central axis 22. A broken line 51b is the broken line along the side face of the semiconductor structure part 3 and the semiconductor substrate 2 in the semiconductor laser 1, which faces the projecting part 46 of the submount 30, and a broken line 51d is the broken line along the rear surface of the semiconductor substrate 2 in the semiconductor laser 1, which faces the bottom plate part 45 of the submount 30. The distance d1 is the distance from the broken line 51a to the broken line 51b, and the distance d2 is the distance from the broken line 51c to the broken line 51d.

A length 11 in the z-direction of the bonding member 40 for bonding the side face of the projecting part 46 of the submount 30 to the side face of a semiconductor laser 1 is approximately the same as a length L1 of the side face of the semiconductor laser 1, and is at least longer than a length from the surface of the bottom plate part 45 to the surface of the semiconductor substrate 2 of the semiconductor laser 1. FIG. 2 shows an example in which an end of the bonding member 40 on the positive side in the z-direction disposed on the side face of the projecting part 46 of the submount 30 is located between the surface of the semiconductor substrate 2 and the surface of the semiconductor structure part 3. In other words, in the bonding member 40 bonding the side face of the projecting part 46 and the side face of the semiconductor laser 1, the end part in the z-direction in which the projecting part 46 projects (portion indicated by broken line 55c) is located further away in the z-direction than the surface of the semiconductor substrate 2 of the semiconductor laser 1. Further, in the submount 30, an end part in the z-direction in which the projecting part 46 projects (portion indicated by broken line 47b) is located further in the z-direction than the surface of the first electrode 8 of the semiconductor laser 1. The broken line 55a is the broken line along the surface of the semiconductor structure part 3 of the semiconductor laser 1, and a broken line 55b is the broken line along the surface of the second electrode 9 on the negative side in the z-direction in the semiconductor laser 1, namely, the rear surface. The broken line 55c is the broken line in contact with the end of the bonding member 40 on the positive side in the z-direction, the end being furthest from the bottom plate part 45 of the submount 30 in the z-direction. As described above, the broken line 48 is the broken line along the surface of the submount 30 facing the rear surface of the semiconductor laser 1. More specifically, the broken line 48 is also the broken line in contact with an end of the bonding member 40 on the negative side in the z-direction, and is the broken line along a surface of the metal layer 32 formed on the bottom plate part 45 of the submount 30, the surface facing the semiconductor laser 1. The length L1 is the length from the broken line 55a to the broken line 55b, and the length 11 is the length from the broken line 55c to the broken line 48.

A structural example of the semiconductor laser 1 will be described in detail. The semiconductor substrate 2 is, for example, an InP substrate of a first conductivity type. The semiconductor structure part 3 of the semiconductor laser 1 is formed on the surface of the semiconductor substrate 2 made of InP of the first conductivity type. The semiconductor structure part 3 of the semiconductor laser 1 is provided with a cladding layer 4 made of InP of the first conductivity type, the active layer 5, a cladding layer 6 made of InP of a second conductivity type, an embedded layer 12 made of InP, a contact layer 7 made of InGaAs of the second conductivity type, and an insulating film 11 made of $SiO_2$ or the like. The first electrode 8, which is the surface electrode formed on the surface of the semiconductor structure part 3 opposite to the semiconductor substrate 2, is connected to the contact layer 7 through an opening 15 formed in the insulating film 11. The part between a broken line 52c and a broken line 52d is the semiconductor structure part 3. The broken line 52c is the broken line along the boundary between the semiconductor substrate 2 and the embedded layer 12, and the broken line 52d is the broken line along the surface of the insulating film 11. The second electrode 9 serving as the rear surface electrode and the first electrode 8 serving as the front surface electrode are made of, for example, TiAu or AuZn. The active layer 5 is composed of a multiple quantum well containing InGaAsP, AlGaInAs, AlInAs, and the like. In the case where the first conductivity type is n-type and the second conductivity type is p-type, the first electrode 8 is an anode electrode and the second electrode 9 is a cathode electrode. In the case where the first conductivity type is p-type and the second conductivity type is n-type, the first electrode 8 is the cathode electrode and the second electrode 9 is the anode electrode. The cladding layer 4, the active layer 5 and part of the cladding layer 6 form a mesa stripe 13, which is a mesa extending in the x-direction. The portion between a broken line 52a and a broken line 52b is the mesa stripe 13. The embedded layer 12 is formed on both sides of the mesa stripe 13 in the y-direction, and further, grooves 10a and 10b penetrating the semiconductor structure part 3 and reaching the semiconductor substrate 2 are formed.

An outline of a method of manufacturing the semiconductor structure part 3 will be described. The mesa stripe 13 is formed by dry etching of part of the cladding layer 4, the active layer 5 and the cladding layer 6 using a mask of $SiO_2$, which are sequentially formed on the semiconductor substrate 2. The embedded layer 12 is formed on the semiconductor substrate 2 exposed by the dry etching on both sides of the mesa stripe 13 in the y-direction. The cladding layer 6 and the contact layer 7 are formed on the surface of the embedded layer 12 and the surface of the mesa stripe 13, and the grooves 10*a* and 10*b* are formed by wet etching using a photoresist mask. The photoresist mask is removed, and the insulating film 11 is formed on the surface of the contact layer 7 and the grooves 10*a* and 10*b*. The opening 15 of the insulating film 11 is formed by using a photoresist mask. Thereafter, the photoresist mask is removed, and a metal layer of an electrode material is formed on the front and rear surfaces of the semiconductor laser 1 to form the first electrode 8 and the second electrode 9.

The base 31 of the submount 30 is made of, for example, AN. The material of the metal layer 32 is, for example, Au. The bonding member 40 is a solder material such as AuSn, a conductive resin paste, or the like.

In the semiconductor laser device 100 of Embodiment 1, unlike a typical semiconductor laser device in which a semiconductor laser is mounted on one surface of a simple rectangular parallelepiped shaped submount, the submount 30 is provided with a bottom plate part 45 and the projecting part 46 projecting from the bottom plate part 45 in the z-direction, and the second electrode 9 on the rear surface side and the side face in the semiconductor laser 1 are bonded to the surface of the bottom plate part 45 and the side face of the projecting part 46 of the submount 30, so that heat can be dissipated from the rear surface and the side face of the semiconductor laser 1 to the submount 30. In addition, in the semiconductor laser device 100 of Embodiment 1, almost whole of the side face of the semiconductor laser 1 facing the submount 30, for example, the whole of the side face of the semiconductor substrate 2 of the semiconductor laser 1 is bonded to the projecting part 46 of the submount 30, so that the heat dissipation from the side face of the semiconductor laser 1 to the submount 30 can be improved as compared with the semiconductor laser device of Patent Document 1 and the semiconductor laser device of Patent Document 2, and an uncooled operation is possible in a wide temperature range of −40° C. to 95° C. Furthermore, in the semiconductor laser device 100 of Embodiment 1, by making the distance d1 from the central axis 22 of the active layer 5 to the side face facing the projecting part 46 of the submount 30 shorter than the distance d2 from the central axis 22 of the active layer 5 to the rear surface of the semiconductor substrate 2 facing the bottom plate part 45 of the submount 30, that is, by disposing the active layer 5 at the offset position from the center in the y-direction toward the projecting part 46 side of the submount 30, the uncooled operation can be achieved in a wide temperature range of −40° C. to 95° C. even in a semiconductor laser 1 having a large output of the emitted light and a large power consumption as compared with the case where the active layer 5 is not at the offset position in the y-direction.

As described above, the semiconductor laser device 100 of Embodiment 1 is provided with the submount 30 including the bottom plate part 45 and the projecting part 46 projecting from the surface of the bottom plate part 45, and the semiconductor laser 1 bonded to the submount 30. The semiconductor laser 1 is provided with the semiconductor substrate 2, the semiconductor structure part 3 including the active layer 5 that is formed on the surface of the semiconductor substrate 2 and generates light emitted from the emission end face 21, the first electrode 8 formed on the surface of the semiconductor structure part 3 opposite to the semiconductor substrate 2, and the second electrode 9 formed on the rear surface of the semiconductor substrate 2. The side face of the semiconductor laser 1 facing the projecting part 46, and the second electrode 9 are respectively bonded to the side face of the projecting part 46 facing the semiconductor laser 1 and the surface of the bottom plate part 45 with the bonding member 40. In the bonding member 40 bonding the side face of the projecting part 46 and the side face of the semiconductor laser 1, the end part in the z-direction in which the projecting part 46 projects is located further away in the z-direction than the surface of the semiconductor substrate 2 of the semiconductor laser 1. In the semiconductor laser device 100 of Embodiment 1, with this configuration, the side face of the semiconductor laser 1 and the second electrode 9 on the rear surface side thereof are bonded with the bonding member 40 to the side face of the projecting part 46 of the submount 30 and the surface of the bottom plate part 45 thereof that are respectively facing them, and the end part of the bonding member 40 in the z-direction that bonds the side face of the projecting part 46 and the side face of the semiconductor laser 1 is located further away than the surface of the semiconductor substrate 2, so that the uncooled operation can be performed over a wide temperature range.

Embodiment 2

Figure 5:
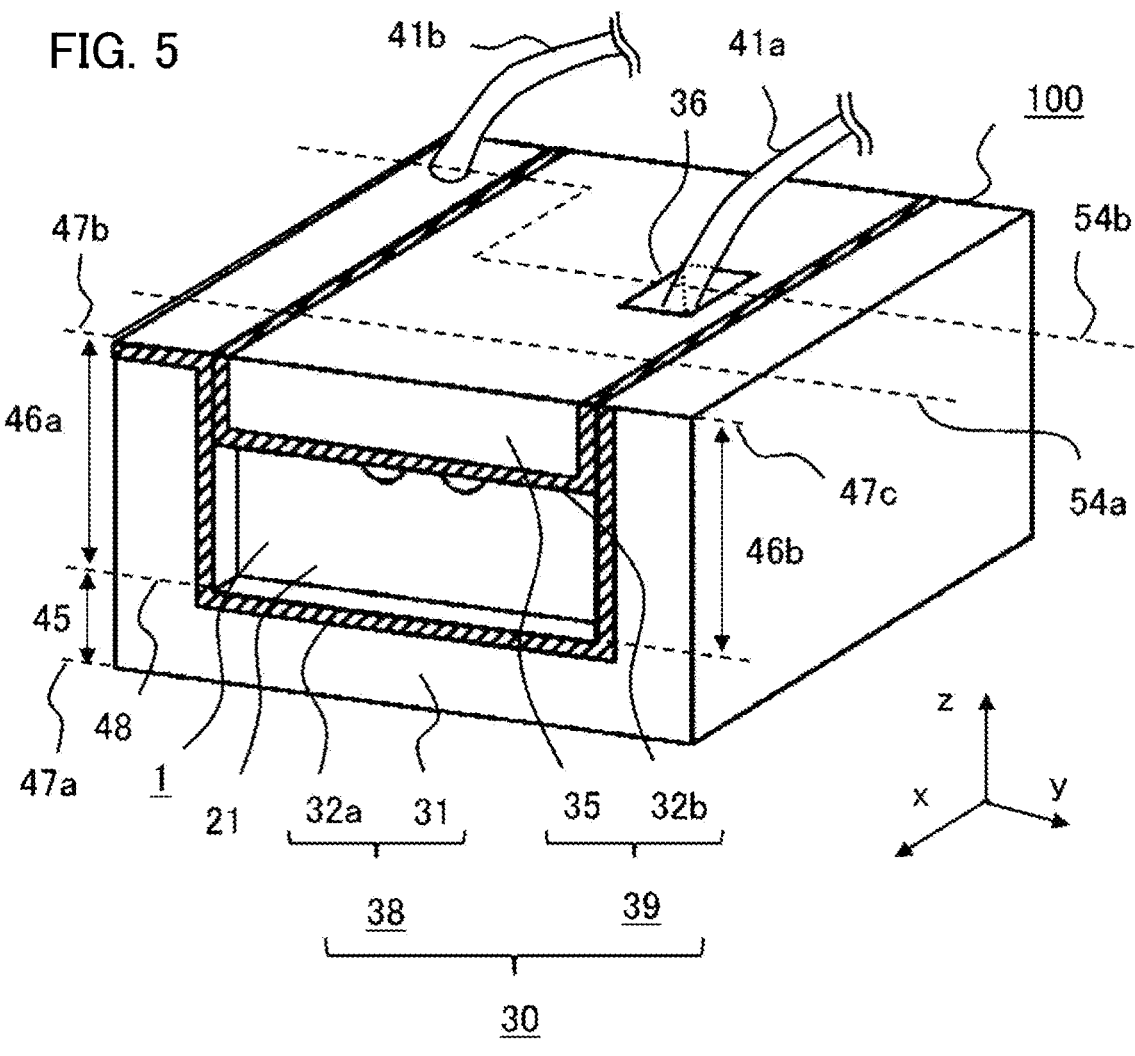
FIG. 5 is a perspective view showing a semiconductor laser device according to Embodiment 2.
Figure 6:
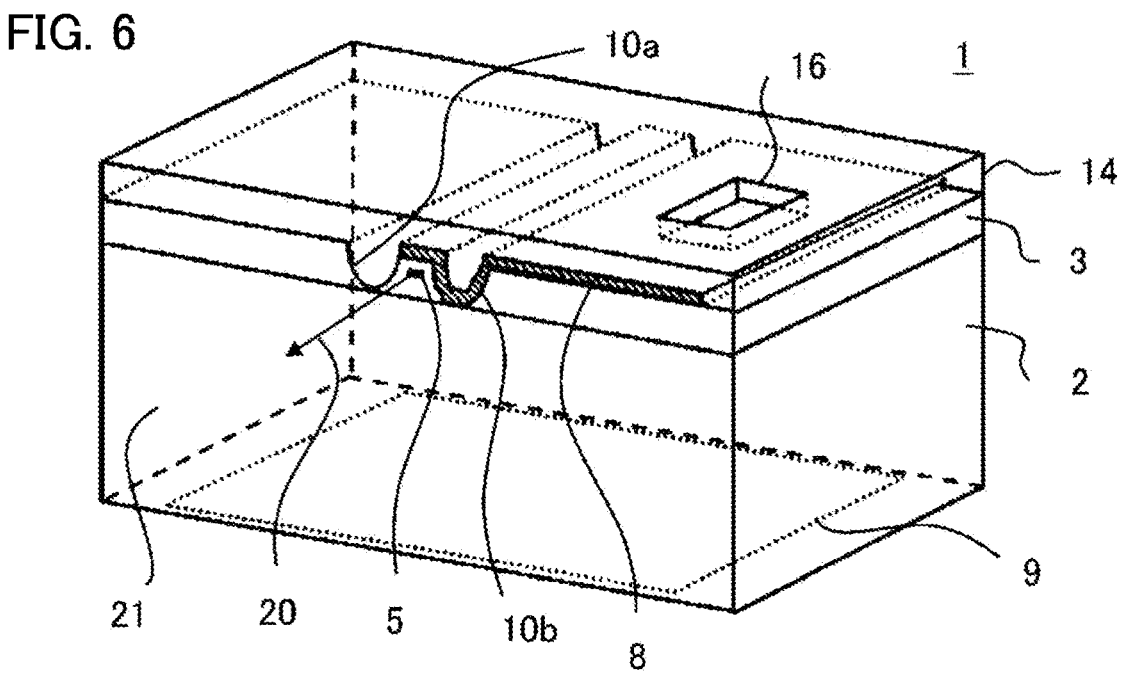
FIG. 6 is a perspective view showing the semiconductor laser of FIG. 5.
Figure 7:
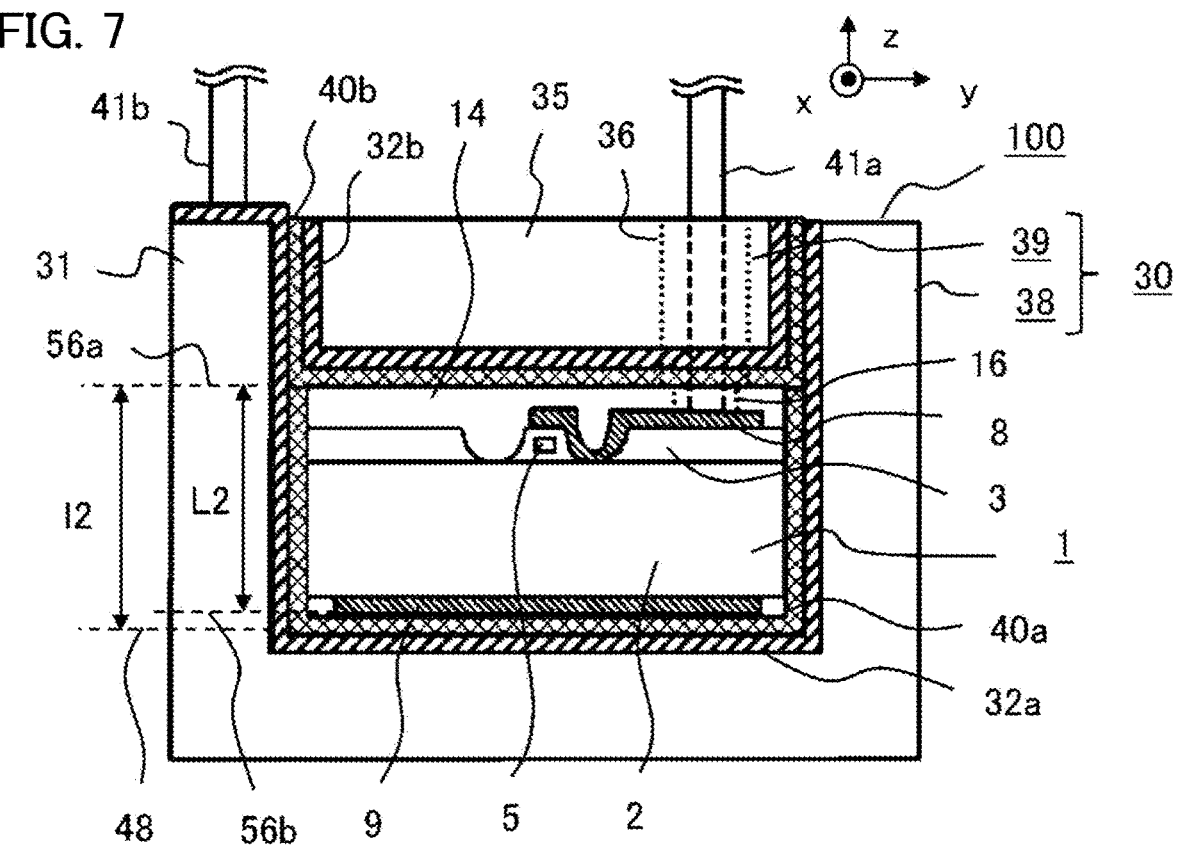
FIG. 7 is a first cross-sectional view of the semiconductor laser device of FIG. 5.
Figure 8:
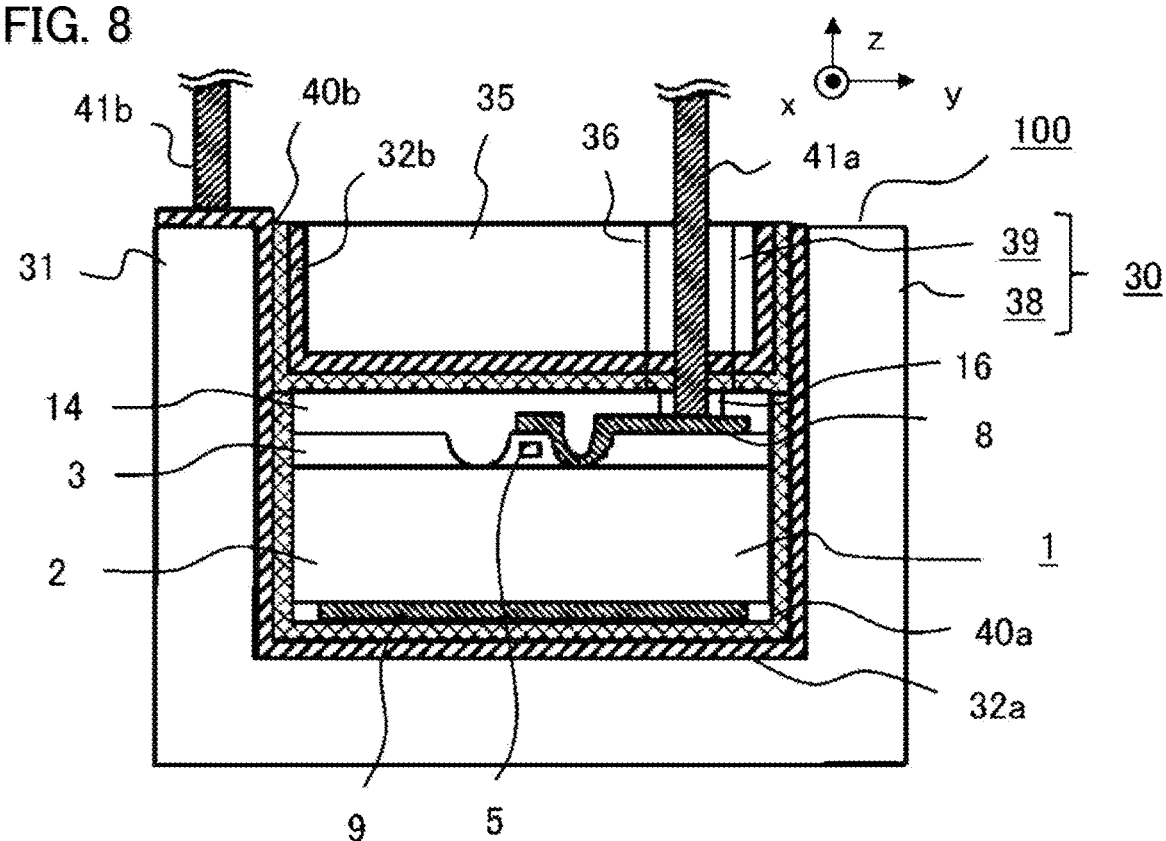
FIG. 8 is a second cross-sectional view of the semiconductor laser device of FIG. 5.
Figure 9:
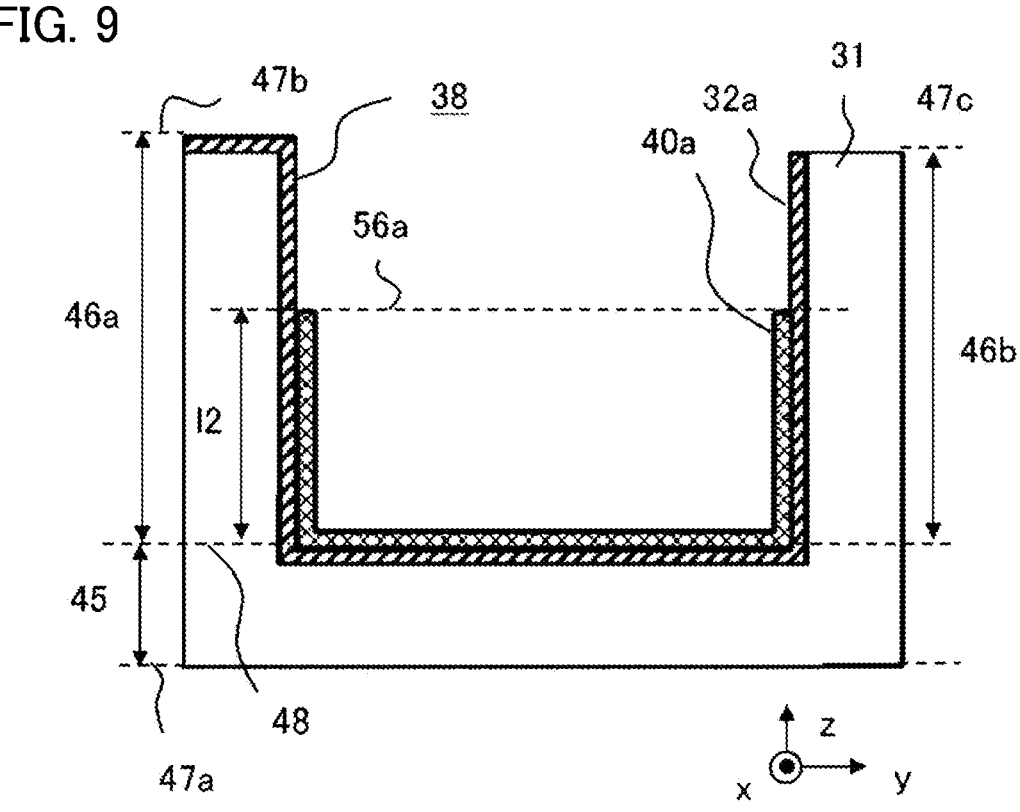
FIG. 9 is a cross-sectional view showing a main body of a submount of FIG. 5.
Figure 10:
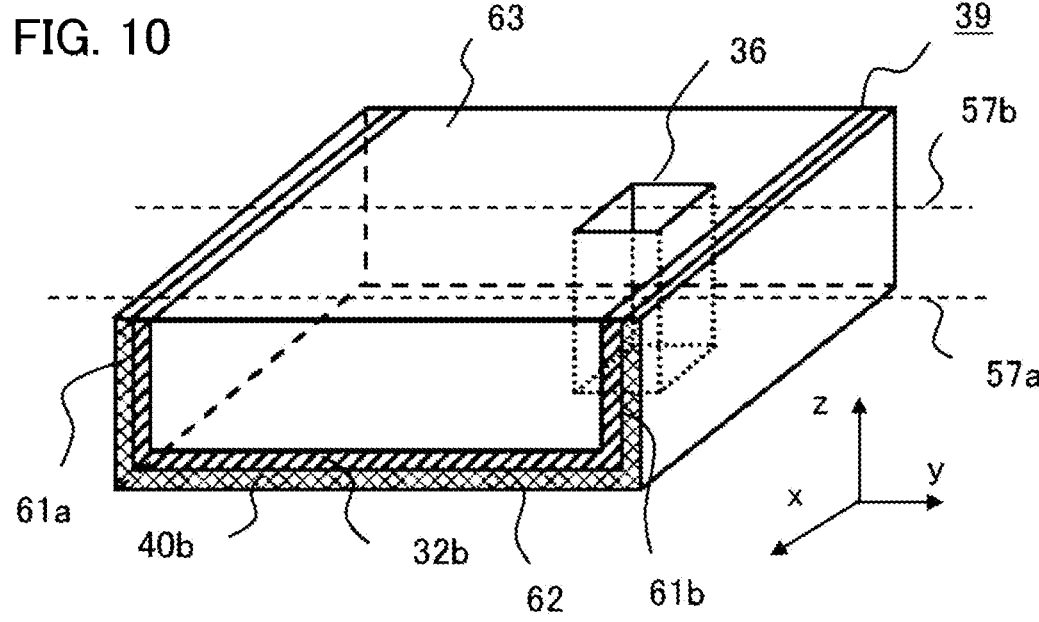
FIG. 10 is a perspective view showing a lid of the submount of FIG. 5.
Figure 11:
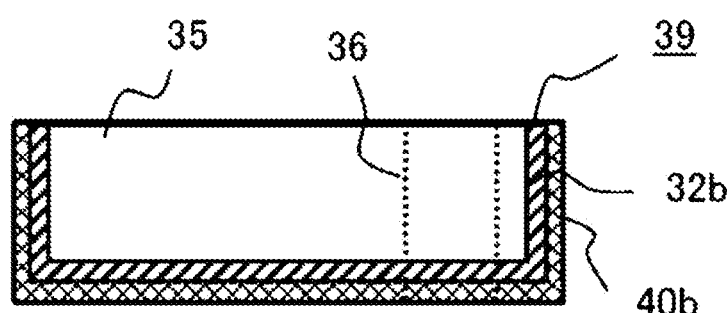
FIG. 11 is a first cross-sectional view of the lid of the submount of FIG. 10.
Figure 12:
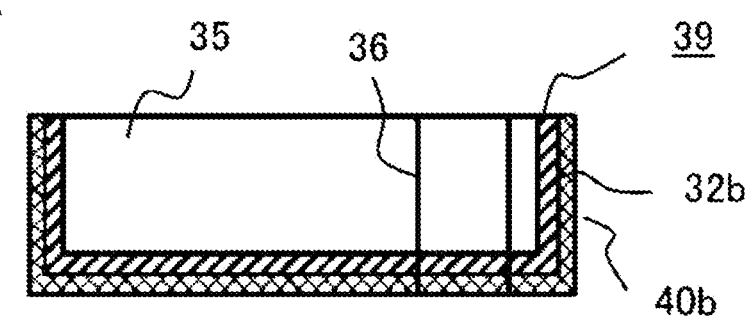
FIG. 12 is a second cross-sectional view of the lid of the submount of FIG. 10.
Figure 13:
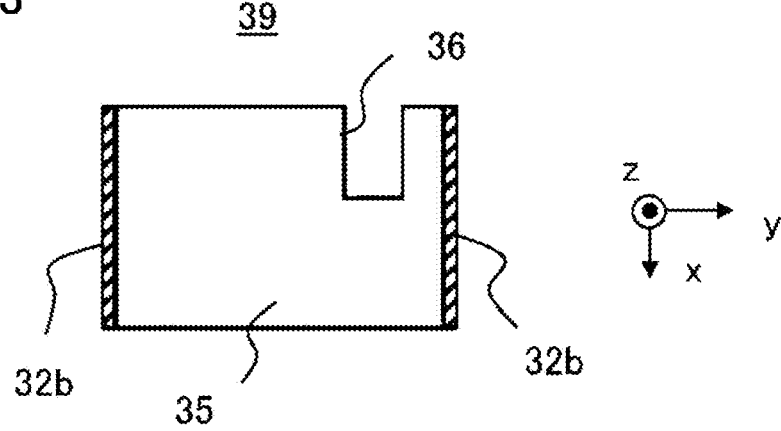
FIG. 13 is a plan view showing another lid of the submount of FIG. 5.

FIG. 5 is a perspective view showing a semiconductor laser device according to Embodiment 2, and FIG. 6 is a perspective view showing the semiconductor laser of FIG. 5. FIG. 7 is a first cross-sectional view of the semiconductor laser device of FIG. 5, and FIG. 8 is a second cross-sectional view of the semiconductor laser device of FIG. 5. FIG. 9 is a cross-sectional view showing a main body of the submount of FIG. 5, and FIG. 10 is a perspective view showing a lid of the submount of FIG. 5. FIG. 11 is a first cross-sectional view of the lid of the submount of FIG. 10 and FIG. 12 is a second cross-sectional view of the lid of the submount of FIG. 10. FIG. 13 is a top view showing another lid of the submount of FIG. 5. FIG. 7 shows a cross section cut parallel to the z-direction to include a broken line 54*a* shown in FIG. 5 and, FIG. 8 shows a cross section cut parallel to the z-direction to include a broken line 54*b* shown in FIG. 5. FIG. 11 shows a cross section cut parallel to the z-direction to include a broken line 57*a* shown in FIG. 10, and FIG. 12 shows a cross section cut in parallel to the z-direction to include a broken line 57*b* shown in FIG. 10. Note that, in FIG. 5, a pattern of a metal layer 32*a* on the positive side in the z-direction in a projecting part 46*b* is omitted. In addition, in FIG. 10, patterns of a metal layer 32*b* and a bonding member 40*b* on the positive side in the z-direction are omitted. The semiconductor laser device 100 of Embodiment 2 is an example in which the submount 30 and the semiconductor laser 1 are bonded to each other at four surfaces of the semiconductor laser 1, that is, at surfaces in the z-direction and the y-direction other than the emission end face 21 and the end face opposite to the emission end face 21. The semiconductor laser device 100 of Embodiment 2 is different from the semiconductor laser device 100 of Embodiment 1 in that the submount 30 and the semiconductor laser 1 are bonded to each other on inner surfaces of the submount 30 having a main body 38 and a lid 39, that is, on inner surfaces in the z-direction and inner surfaces in the y-direction of the submount 30. Differences from the semiconductor laser device 100 of Embodiment 1 will be mainly described.

A semiconductor laser 1 of Embodiment 2 includes the semiconductor substrate 2, the semiconductor structure part 3 that is formed on the surface of the semiconductor substrate 2 and has the active layer 5 for generating light, the first electrode 8 that is the surface electrode formed on the surface of the semiconductor structure part 3 opposite to the semiconductor substrate 2, the second electrode 9 that is the rear surface electrode formed on the rear surface side of the semiconductor substrate 2, and a protective film 14 that is formed on the surface of the semiconductor structure part 3 on the positive side in the z-direction, the surface of the first electrode 8 on the positive side in the z-direction and the surfaces thereof in the y-direction. An opening 16 for exposing part of the first electrode 8 is formed in the protective film 14. The protective film 14 is a resin film such as polyimide and is formed during the wafer process of the semiconductor laser 1. The protective film 14 is spin-coated with a liquid resin material, and the opening 16 is formed by wet etching using a photoresist mask. The submount 30 of Embodiment 2 includes the main body 38 and the lid 39. The main body 38 has the base 31 and the metal layer 32a that is formed on the side where the semiconductor laser 1 is to be mounted in the base 31. The lid 39 has a base 35, a metal layer 32b formed on the side of the base 35 facing the semiconductor laser 1 and the sides of the base 35 facing the main body 38. The lid 39 is formed with an opening 36, which is a through hole through which the wire 41a to be connected to the first electrode 8 of the semiconductor laser 1 passes. The opening 36 penetrates from a lid rear surface 62 of the lid 39 to a lid front surface 63. The first electrode 8 is exposed through the opening 16 of the protective film 14 and the opening 36 of the lid 39.

The main body 38 includes the bottom plate part 45 and two projecting parts 46a and 46b projecting from the bottom plate part 45 in the z-direction, and the cross-sectional shape of the main body 38 perpendicular to the x axis is a U-shape or a shape having a depressed part. The bottom plate part 45 extends from the broken line 47a to the broken line 48, the projecting part 46a on the negative side in the y-direction extends from the broken line 48 to the broken line 47b, and the projecting part 46b on the positive side in the y-direction extends from the broken line 48 to the broken line 47c. The broken line 47b is the broken line in contact with the furthest portion on the positive side in the z-direction, the portion being located furthest away on the positive side in the z-direction from the rear surface of the main body 38, and is the broken line in contact with the furthest portion on the positive side in the z-direction in the projecting part 46a on the negative side in the y-direction. The broken line 47c is the broken line in contact with the furthest portion in the z-direction in the projecting part 46b on the positive side in the y-direction. The metal layer 32a is formed on a surface of the base 31 in the bottom plate part 45, a surface of the base 31 on the positive side in the y-direction in the projecting part 46a, and a surface of the base 31 on the negative side in the y-direction in the projecting part 46b, which are the inner surfaces being the surfaces of the main body 38 facing the semiconductor laser 1. The metal layer 32a is also formed on a surface of the base 31 in the z-direction in the projecting part 46a. It can be said that the metal layer 32a is formed on the surface of the bottom plate part 45, the surface of the projecting part 46a on the positive side in the y-direction, and the surface of the projecting part 46b on the negative side in the y-direction, which are inner surfaces being the surfaces of the main body 38 facing the semiconductor laser 1.

FIG. 5, FIG. 7, and FIG. 8 show an example in which the metal layer 32a is also formed on the surface of the projecting part 46a on the positive side in the z-direction in the base 31, and thus the metal layer 32a is formed on the inner surfaces of the base 31 of the main body 38, and on the surface on the positive side in the z-direction in the projecting part 46a, which is one of the two projecting parts 46a and 46b. In the semiconductor laser 1, the second electrode

9 and both side faces that are on the sides in the y-direction and face the main body 38 are bonded to the metal layer 32a of the main body 38 with the bonding member 40a such as a solder material. Further, in the semiconductor laser 1, the surface opposite to the semiconductor substrate 2, that is, the surface of the protective film 14 is bonded to the metal layer 32b of the lid 39 with the bonding member 40b such as a solder material. The surfaces of the metal layer 32b of the lid 39 on both sides in the y-direction are bonded to the metal layer 32a of the respective projecting parts 46a and 46b of the main body 38 facing each other, with the bonding member 40b such as a solder material. That is, in the lid 39, a first lid side face 61a facing the side face of the projecting part 46a, a second lid side face 61b facing the side face of the other projecting part 46b, and a lid rear surface 62 facing the surface of the protective film 14 of the semiconductor laser 1 are bonded to the side face of the projecting part 46a, the side face of the other projecting part 46b, and the surface of the protective film 14, respectively, with another bonding member 40b. In FIG. 5, FIG. 7 and FIG. 8, the wire 41a connected to the first electrode 8 of the semiconductor laser 1 and the wire 41b connected to the metal layer 32a of the main body 38 of the submount 30 are also shown. The semiconductor laser device 100 is to be connected to an external circuit or the like with the wires 41a and 41b.

A length l2 in the z-direction of the bonding member 40a for bonding the side faces of the projecting parts 46a and 46b of the main body 38 of the submount 30 and the side faces of the semiconductor laser 1 is approximately the same as a length L2 of each of the side faces of the semiconductor laser 1, and is at least longer than a length from the surface of the bottom plate part 45 to the surface of the semiconductor structure part 3 of the semiconductor laser 1. FIG. 7 and FIG. 8 show an example in which an end on the positive side in the z-direction in the bonding member 40a disposed on the side faces of the projecting parts 46a and 46b of the main body 38 of the submount 30 is at a position in the z-direction equal to the surface of the protective film 14. In other words, in the bonding member 40a bonding the side faces of the projecting parts 46a and 46b and the side faces of the semiconductor laser 1, the end part (portion at broken line 56a) in the z-direction in which the projecting parts 46a and 46b project is located further away in the z-direction than the surface of the semiconductor substrate 2 of the semiconductor laser 1. The broken line 56a is the broken line along the front surface of the protective film 14 in the semiconductor laser 1, and the broken line 56b is the broken line along the surface of the second electrode 9 on the negative side in the z-direction in the semiconductor laser 1, namely, along the rear surface. In addition, the broken line 56a is also the broken line in contact with the end of the bonding member 40a on the positive side in the z-direction, which is furthest in the z-direction from the bottom plate part 45 of the main body 38 of the submount 30. The broken line 48 is the broken line along the surface of the main body 38 of the submount 30 facing the rear surface of the semiconductor laser 1. More specifically, the broken line 48 is also the broken line in contact with the end of the bonding member 40a on the negative side in the z-direction, and is the broken line along the surface of the metal layer 32a formed on the bottom plate part 45 of the main body 38, the surface facing the semiconductor laser 1. The length L2 is the length from the broken line 56a to the broken line 56b, and the length l2 is the length from the broken line 56a to the broken line 48.

A method of manufacturing the semiconductor laser device 100 of Embodiment 2 will be described. As shown in FIG. 9, the bonding member 40*a* is formed on the inner surfaces of the main body 38 of the submount 30, that is, on the surfaces of the metal layer 32*a*, the semiconductor laser 1 is placed on the inner surfaces of the main body 38 of the submount 30, and the semiconductor laser 1 and the main body 38 of the submount 30 are bonded together with the bonding member 40*a* (first step). Thereafter, as shown in FIG. 10 to FIG. 12, the bonding member 40*b* is formed on surfaces of the metal layer 32*b*, the surfaces being those of the lid 39 that are to face the semiconductor laser 1 and the main body 38, and after placing the lid 39 on the surface of the semiconductor laser 1 mounted on the main body 38, the lid 39 is bonded to the semiconductor laser 1 and the main body 38 with the bonding member 40*b* (second step). In the case where the bonding members 40*a* and 40*b* are a solder material, the semiconductor laser 1, the main body 38, and the lid 39 may be simultaneously bonded to one another by melting the bonding members 40*a* and 40*b* in the second step without completely bonding the semiconductor laser 1 and the main body 38 in the first step.

In the semiconductor laser device 100 of Embodiment 2, the main body 38 of the submount 30 includes the bottom plate part 45 and two projecting parts 46*a* and 46*b* projecting from the bottom plate part 45 in the z-direction, and the second electrode 9 on the rear surface side of the semiconductor laser 1 and both side faces thereof are bonded to the surface of the bottom plate part 45 of the main body 38 of the submount 30 and the inner surfaces of the projecting parts 46*a* and 46*b*, that is, the side faces of the projecting parts 46*a* and 46*b* on the side facing the semiconductor laser 1, so that heat can be dissipated from the rear surface and both side faces of the semiconductor laser 1 to the submount 30. Further, in the semiconductor laser device 100 of Embodiment 2, since the lid 39 of the submount 30 is bonded to the protective film 14 formed on the surface of the semiconductor laser 1, and the inner surfaces of the projecting parts 46*a* and 46*b* of the main body 38, heat can be dissipated to the submount 30 from the four surfaces of the semiconductor laser 1, namely, the rear surface, both side faces, and the surface opposite to the rear surface. Therefore, the semiconductor laser device 100 of Embodiment 2 can improve the heat dissipation to the submount 30 as compared with the semiconductor laser device 100 of Embodiment 1, and can perform the uncooled operation in a wide temperature range of −40° C. to 95° C.

Since the protective film 14 is insulating, the thermal conductivity of the protective film 14 is lower than that of the semiconductor substrate 2 and the semiconductor structure part 3, but the heat dissipation can be improved as compared with a semiconductor laser device in which the protective film 14 is replaced with an air gap. In the semiconductor laser device 100 of Embodiment 2, since the inner surfaces of the submount 30 excluding the opening 36 of the lid 39 are bonded with almost no gap to the rear surface, both side faces, and the front surface, which are four surfaces of the semiconductor laser 1 facing the submount 30, with the bonding members 40*a* and 40*b*, the heat dissipation to the submount 30 can be improved as compared with the semiconductor laser device 100 of Embodiment 1, and the uncooled operation can be performed in a wide temperature range of −40° C. to 95° C. Note that the side faces of the second electrode 9 in the y-direction recede from the side faces of the semiconductor substrate 2 in the y-direction, and there are air gaps between the second electrode 9 and the main body 38 of the submount 30. Since the thermal conductivity in the second electrode 9 or the semiconductor substrate 2 is larger than that of the air gaps, there is no problem even if there are some air gaps between the second electrode 9 and the main body 38 of the submount 30. Further, the side faces of the second electrode 9 in the y-direction may be substantially flush with the side faces of the semiconductor substrate 2 in the y-direction. In this case, the inner surfaces of the submount 30 excluding the opening 36 of the lid 39 are bonded without any gap to the four opposed surfaces of the semiconductor laser 1, namely, the rear surface, both side faces, and the front surface, with the bonding members 40*a* and 40*b*.

In the semiconductor laser device 100 of Embodiment 2, for example the active layer 5 of the semiconductor laser 1 in the y-direction is not at the offset position unlike the semiconductor laser 1 of Embodiment 1. The position of the active layer 5 of the semiconductor laser 1 in the y-direction is preferably such that the thermal resistance from the active layer 5 to the projecting part 46*b* of the main body 38 on the positive side in the y-direction should be substantially equal to the thermal resistance from the active layer 5 to the projecting part 46*a* of the main body 38 on the negative side in the y-direction. The opening 36 is an example of a through hole penetrating from the lid rear surface 62 of the lid 39 to the lid front surface 63, but is not limited to this. The opening 36 should penetrate from the lid rear surface 62 of the lid 39 to the lid front surface 63 thereof so that at least part of the first electrode 8 to which the wire 41*a* is to be connected is exposed. For example, as shown in FIG. 13, the opening 36 may be connected to the surface (side face) of the lid 39 in the x-direction.

As described above, the semiconductor laser device 100 of Embodiment 2 is provided with the main body 38 including the bottom plate part 45, the projecting part 46*a* projecting from the surface of the bottom plate part 45, and the other projecting part 46*b* projecting from the surface of the bottom plate part 45, the submount 30 including the lid 39 bonded to the projecting part 46*a* and the other projecting part 46*b*, and the semiconductor laser 1 bonded to the submount 30. The semiconductor laser 1 is provided with the semiconductor substrate 2, the semiconductor structure part 3 that is formed on the surface of the semiconductor substrate 2 and has the active layer 5 for generating light emitted from an emission end face 21, the first electrode 8 formed on the surface of the semiconductor structure part 3 opposite to the semiconductor substrate 2, the second electrode 9 formed on the rear surface of the semiconductor substrate 2, and the protective film 14 formed on the surface of the semiconductor structure part 3 and the surface of the first electrode 8. The side face of the semiconductor laser 1 facing the projecting part 46*a* and the second electrode 9 thereof are respectively bonded to the side face of the projecting part 46*a* facing the semiconductor laser 1 and the surface of the bottom plate part 45 with the bonding member 40*a*. The side face of the semiconductor laser 1 facing the other projecting part 46*b* is bonded to the side face of the other projecting part 46*b* facing the semiconductor laser 1 with the bonding member 40*a*. In the bonding member 40*a* that bonds the side face of the projecting part 46*a* and the side face of the semiconductor laser 1, the end part in the z-direction in which the projecting part 46*a* projects is located further away in the z-direction than the surface of the semiconductor substrate 2 of the semiconductor laser 1. In the bonding member 40*a* that bonds the side face of the other projecting part 46*b* and the side face of the semiconductor laser 1, another end part in the z-direction in which the other projecting part 46*b* projects is located further away in the z-direction than the surface of the semiconductor substrate 2 of the semiconductor laser 1. In the lid 39, the first lid side face 61*a* facing the side face of the projecting part 46*a*, the second lid side face 61*b* facing the side face of the other projecting part 46*b*, and the lid rear surface 62 facing the surface of the protective film 14 of the semiconductor laser 1 are bonded to the side face of the projecting part 46*a*, the side face of the other projecting part 46*b*, and the surface of the protective film 14 that respectively face one another, with another bonding member 40*b*. In the semiconductor laser device 100 of Embodiment 2, with the configuration, both side faces of the semiconductor laser 1 and the second electrode 9 on the rear surface side thereof are bonded to the side faces of projecting parts 46*a* and 46*b* of the submount 30 and the surface of the bottom plate part 45 thereof that respectively face one another, the end part in the z-direction in the bonding member 40*a* bonding the side faces of the projecting parts 46*a* and 46*b* and the side faces of the semiconductor laser 1 is located further away than the surface of the semiconductor substrate 2, and the lid 39 is boned to the side faces of the projecting parts 46*a* and 46*b* and the surface of the protective film 14 with another bonding member 40*b*, so that the uncooled operation can be performed over a wide temperature range.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor laser, 2: semiconductor substrate, 3: semiconductor structure part, 5: active layer, 8: first electrode, 9: second electrode, 14: protective film, 16: opening, 18: center between side faces, 21: emission end face, 22: central axis, 30: submount, 36: opening, 38: main body, 39: lid, 40, 40*a*, 40*b*: bonding member, 45: bottom plate part, 46, 46*a*, 46*b*: projecting part, 61*a*, 61*b*: lid side face, 62: lid rear surface, 63: lid front surface, 100: semiconductor laser device, d1: distance, d2: distance

The invention claimed is:

1. A semiconductor laser device comprising:
a submount including a bottom plate part and a projecting part projecting from a surface of the bottom plate part;
a metal layer formed continuously on a surface of the bottom plate part and on a side face of the projecting part; and
a semiconductor laser bonded to the submount,
wherein the semiconductor laser includes:
a semiconductor substrate;
a semiconductor structure part that is formed on a surface of the semiconductor substrate and has an active layer for generating light emitted from an emission end face;
a first electrode formed on a surface of the semiconductor structure part opposite to the semiconductor substrate; and
a second electrode formed on a rear surface of the semiconductor substrate,
wherein a side face of the semiconductor laser facing the projecting part, and the second electrode are respectively bonded to a side face of the projecting part facing the a side face of the semiconductor laser facing the projecting part is bonded to the metal layer on the side face of the projecting part facing the semiconductor laser with a bonding member, and a surface of the second electrode facing the bottom plate part is bonded to the metal layer on the surface of the bottom plate part facing the second electrode with the bonding member,
a z-direction is defined to be a direction in which the projecting part projects from the surface of the bottom plate part,
the bonding member is such that an end part thereof in the z-direction in a portion in which the side face of the projecting part and the side face of the semiconductor laser are bonded is located further away in the z-direction than the surface of the semiconductor substrate of the semiconductor laser, and
the submount is such that an end part of the projecting part in the z-direction is located further away in the z-direction than a surface of the first electrode of the semiconductor laser.

2. The semiconductor laser device according to claim 1, wherein
a direction in which the active layer of the semiconductor laser extends is defined as an x-direction, and a direction perpendicular to the x-direction and the z-direction is defined as a y-direction, and
the active layer is disposed closer to the projecting part than a center between both side faces of the semiconductor laser in the y-direction.

3. The semiconductor laser device according to claim 1, wherein a distance from a central axis of the active layer to the side face of the semiconductor laser facing the projecting part is shorter than a distance from the central axis of the active layer to the rear surface of the semiconductor substrate, the central axis thereof being in a direction in which the active layer extends.

4. The semiconductor laser device according to claim 2, wherein a distance from a central axis of the active layer to the side face of the semiconductor laser facing the projecting part is shorter than a distance from the central axis of the active layer to the rear surface of the semiconductor substrate, the central axis thereof being in a direction in which the active layer extends.

5. A semiconductor laser device comprising:
a submount including a main body having a bottom plate part, a projecting part projecting from a surface of the bottom plate part, and an other projecting part projecting from the surface of the bottom plate part, and a lid bonded to the projecting part and the other projecting part, and
a semiconductor laser bonded to the submount,
wherein
the semiconductor laser includes:
a semiconductor substrate;
a semiconductor structure part that is formed on a surface of the semiconductor substrate and has an active layer for generating light emitted from an emission end face;
a first electrode formed on a surface of the semiconductor structure part opposite to the semiconductor substrate;
a second electrode formed on a rear surface of the semiconductor substrate; and
a protective film formed on the surface of the semiconductor structure part and a surface of the first electrode,
wherein
a side face of the semiconductor laser facing the projecting part, and the second electrode are respectively bonded to a side face of the projecting part facing the semiconductor laser and a surface of the bottom plate part with a bonding member, a side face of the semiconductor laser facing the other projecting part is bonded to a side face of the other projecting part facing the semiconductor laser with the bonding member, a z-direction is defined to be a direction in which the projecting part and the other projecting part project from the surface of the bottom plate part, the bonding member is such that an end part thereof in the z-direction in a portion in which the side face of the projecting part and the side face of the semiconductor laser are bonded is located further away in the z-direction than the surface of the semiconductor substrate of the semiconductor laser, and another end part thereof in the z-direction in a portion in which the side face of the other projecting part and the side face of the semiconductor laser are bonded is located further away in the z-direction than the surface of the semiconductor substrate of the semiconductor laser, and the lid is such that a first lid side face thereof facing the side face of the projecting part, a second lid side face thereof facing the side face of the other projecting part, and a lid rear surface facing a surface of the protective film of the semiconductor laser are bonded to the side face of the projecting part, the side face of the other projecting part, and the surface of the protective film that are respectively facing one another, with another bonding member.

6. The semiconductor laser device according to claim 5, wherein a first opening is formed in the protective film of the semiconductor laser, a second opening is formed in the lid of the submount so as to penetrate from the lid rear surface to a lid front surface opposite to the lid rear surface, and the first electrode is exposed through the first opening and the second opening.

7. A semiconductor laser device comprising:

a submount including a main body having a bottom plate part, a projecting part projecting from a surface of the bottom plate part, and an other projecting part projecting from the surface of the bottom plate part, and a lid bonded to the projecting part and the other projecting part; and a semiconductor laser bonded to the submount, wherein the semiconductor laser includes:

a semiconductor substrate;

a semiconductor structure part that is formed on a surface of the semiconductor substrate and has an active layer for generating light emitted from an emission end face;

a first electrode formed on a surface of the semiconductor structure part opposite to the semiconductor substrate;

a second electrode formed on a rear surface of the semiconductor substrate; and a protective film formed on the surface of the semiconductor structure part and a surface of the first electrode, wherein a side face of the semiconductor laser facing the projecting part, and the second electrode are respectively bonded to a side face of the projecting part facing the semiconductor laser and a surface of the bottom plate part with a bonding member, a side face of the semiconductor laser facing the other projecting part is bonded to a side face of the other projecting part facing the semiconductor laser with the bonding member, a z-direction is defined to be a direction in which the projecting part and the other projecting part project from the surface of the bottom plate part, the bonding member is such that an end part thereof in the z-direction in a portion in which the side face of the projecting part and the side face of the semiconductor laser are bonded is located further away in the z-direction than the surface of the semiconductor substrate of the semiconductor laser, and another end part thereof in the z-direction in a portion in which the side face of the other projecting part and the side face of the semiconductor laser are bonded is located further away in the z-direction than the surface of the semiconductor substrate of the semiconductor laser, the submount is such that an end part of the projecting part in the z-direction and the other end part of the other projecting part in the z-direction are located further away in the z-direction than the surface of the first electrode of the semiconductor laser, and the lid is such that a first lid side face thereof facing the side face of the projecting part, a second lid side face facing the side face of the other projecting part, and a lid rear surface facing a surface of the protective film of the semiconductor laser are bonded to the side face of the projecting part, the side face of the other projecting part, and the surface of the protective film that are respectively facing one another, with another bonding member.

8. The semiconductor laser device according to claim 7, wherein a first opening is formed in the protective film of the semiconductor laser, a second opening is formed in the lid of the submount so as to penetrate from the lid rear surface to a lid front surface opposite to the lid rear surface, and the first electrode is exposed through the first opening and the second opening.

* * * * *